US009818587B2

(12) United States Patent
Ewert et al.

(10) Patent No.: US 9,818,587 B2
(45) Date of Patent: *Nov. 14, 2017

(54) OFF-ANGLED HEATING OF THE UNDERSIDE OF A SUBSTRATE USING A LAMP ASSEMBLY

(71) Applicant: Applied Materials, Inc., Santa Clara, CA (US)

(72) Inventors: Maurice E. Ewert, San Jose, CA (US); Anantha K. Subramani, San Jose, CA (US); Umesh M. Kelkar, Santa Clara, CA (US); Chandrasekhar Balasubramanyam, Bangalore (IN); Joseph M. Ranish, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1100 days.

This patent is subject to a terminal disclaimer.

(21) Appl. No.: 13/827,736

(22) Filed: Mar. 14, 2013

(65) Prior Publication Data

US 2013/0270107 A1    Oct. 17, 2013

Related U.S. Application Data

(63) Continuation of application No. 13/046,261, filed on Mar. 11, 2011, now Pat. No. 8,404,048.

(51) Int. Cl.
*H01J 37/34* (2006.01)
*C23C 14/54* (2006.01)
(Continued)

(52) U.S. Cl.
CPC .......... *H01J 37/3488* (2013.01); *C23C 14/34* (2013.01); *C23C 14/3435* (2013.01);
(Continued)

(58) Field of Classification Search
CPC . C23C 14/541; C23C 14/5806; C23C 16/481; C23C 14/34; C23C 14/3435;
(Continued)

(56) References Cited

U.S. PATENT DOCUMENTS 4,981,815 A * 1/1991 Kakoschke ......... H01L 21/2686
                                                                        118/620
5,518,593 A * 5/1996 Hosokawa .......... C23C 14/3407
                                                                        118/641
(Continued)

FOREIGN PATENT DOCUMENTS

CN    1507648 A    6/2004
CN    1529900 A    9/2004
(Continued)

OTHER PUBLICATIONS

Taiwan Office Action dated Nov. 18, 2015, for corresponding Taiwan Application No. 101108110.
(Continued)

*Primary Examiner* — Michael Band
(74) *Attorney, Agent, or Firm* — Patterson + Sheridan LLP

(57) ABSTRACT

Disclosed are method and apparatus for treating a substrate. The apparatus is a dual-function process chamber that may perform both a material process and a thermal process on a substrate. The chamber has an annular radiant source disposed between a processing location and a transportation location of the chamber. Lift pins have length sufficient to maintain the substrate at the processing location while the substrate support is lowered below the radiant source plane to afford radiant heating of the substrate. A method of processing a substrate having apertures formed in a first surface thereof includes depositing material on the first surface in the apertures and reflowing the material by heating a second surface of the substrate opposite the first
(Continued)

surface. A second material can then be deposited, filling the apertures partly or completely. Alternately, a cyclical deposition/reflow process may be performed.

21 Claims, 6 Drawing Sheets

(51) Int. Cl.

| | |
|---|---|
| C23C 14/34 | (2006.01) |
| C23C 16/48 | (2006.01) |
| H01L 21/67 | (2006.01) |
| H01L 21/687 | (2006.01) |
| H01L 21/324 | (2006.01) |
| H01L 21/768 | (2006.01) |
| C23C 16/458 | (2006.01) |
| H01L 21/285 | (2006.01) |
| H01L 21/02 | (2006.01) |

(52) U.S. Cl.
CPC ........ *C23C 14/541* (2013.01); *C23C 16/4581* (2013.01); *C23C 16/481* (2013.01); *H01J 37/3411* (2013.01); *H01L 21/02104* (2013.01); *H01L 21/2855* (2013.01); *H01L 21/28518* (2013.01); *H01L 21/324* (2013.01); *H01L 21/67115* (2013.01); *H01L 21/67248* (2013.01); *H01L 21/68742* (2013.01); *H01L 21/76882* (2013.01)

(58) Field of Classification Search
CPC .............. C23C 16/4581; H01J 37/3411; H01J 37/3488; H01L 21/67115; H01L 21/68742; H01L 21/324; H01L 21/76882
See application file for complete search history.

(56) References Cited

U.S. PATENT DOCUMENTS

| | | | | |
|---|---|---|---|---|
| 5,561,735 | A * | 10/1996 | Camm | ................. C23C 16/481 118/725 |
| 5,608,227 | A * | 3/1997 | Dierks | ................... C03C 17/23 250/492.1 |
| 5,763,856 | A | 6/1998 | Ohkase | |
| 6,108,491 | A | 8/2000 | Anderson | |
| 6,222,990 | B1 | 4/2001 | Guardado et al. | |
| 6,313,027 | B1 | 11/2001 | Xu et al. | |
| 6,435,869 | B2 | 8/2002 | Kitamura | |
| 6,818,864 | B2 | 11/2004 | Ptak | |
| 6,907,924 | B2 * | 6/2005 | Moslehi | ................. C23C 14/50 118/724 |
| 7,378,618 | B1 | 5/2008 | Sorabji et al. | |
| 2001/0034004 | A1 | 10/2001 | Kitamura | |
| 2003/0029569 | A1 * | 2/2003 | Natsuhara | ........... C23C 16/4581 156/345.51 |
| 2003/0087522 | A1 | 5/2003 | Ngo et al. | |
| 2004/0149715 | A1 | 8/2004 | Timans et al. | |
| 2005/0223993 | A1 | 10/2005 | Blomiley et al. | |
| 2007/0020872 | A1 | 1/2007 | Shindo et al. | |
| 2008/0099326 | A1 * | 5/2008 | Ye | ........................ C23C 14/0623 204/192.25 |
| 2008/0116067 | A1 * | 5/2008 | Lavitsky | ................. C23C 14/35 204/298.12 |
| 2009/0194024 | A1 | 8/2009 | Burrows et al. | |
| 2009/0229971 | A1 * | 9/2009 | Ishihara | ................. C23C 14/50 204/192.13 |
| 2011/0061812 | A1 | 3/2011 | Ganguly et al. | |
| 2011/0175527 | A1 | 7/2011 | Ramer et al. | |
| 2012/0104789 | A1 | 5/2012 | Plavetich et al. | |
| 2012/0155082 | A1 | 6/2012 | Ramer et al. | |
| 2012/0231633 | A1 | 9/2012 | Ewert et al. | |

FOREIGN PATENT DOCUMENTS

| | | | | |
|---|---|---|---|---|
| CN | 101392409 | A | | 3/2009 |
| JP | H01-319934 | A | | 12/1989 |
| JP | H06-69148 | A | | 3/1994 |
| JP | 2000-323487 | A | | 11/2000 |
| JP | WO 0182348 | A1 * | 11/2001 | ........... C23C 16/481 |
| JP | 2002-134429 | A | | 5/2002 |
| JP | 2005-108967 | A | | 4/2005 |
| JP | 2007-214593 | A | | 8/2007 |
| TW | 200946713 | A | | 11/2009 |

OTHER PUBLICATIONS

Chinese Office Action dated Aug. 12, 2015; Application No. 2012800111323.
International Search Report and Written Opinion dated Oct. 31, 2012 for PCT/US2012/028521.
Japanese Office Action dated Mar. 28, 2016 for Application No. 2013-558073.

* cited by examiner

OFF-ANGLED HEATING OF THE UNDERSIDE OF A SUBSTRATE USING A LAMP ASSEMBLY

CROSS-REFERENCE TO RELATED APPLICATIONS

This application is a continuation of co-pending U.S. patent application Ser. No. 13/046,261, filed Mar. 11, 2011. The aforementioned related patent applications is herein incorporated hereby reference.

FIELD

Embodiments disclosed herein relate to semiconductor processing. More specifically, embodiments disclosed herein relate to apparatus and methods for material and thermal processing of semiconductor substrates.

BACKGROUND

Thermal processing is common in semiconductor manufacturing. Semiconductor substrates are often subjected to thermal treatment following a material process such as deposition, implantation, or etching. In many cases, the thermal treatment is performed in a separate chamber from the material process. Transferring the substrate from the material process chamber to the thermal process chamber takes time and reduces production throughput. Machine utilization, the time a machine is operating to process a substrate, is a critical factor in reducing the cost of each chip produced. Thus, there is a continuing need for more efficient semiconductor manufacturing processes and apparatus.

SUMMARY

Disclosed are method and apparatus for treating a substrate using a dual-function process chamber that may perform both a material process and a thermal process on a substrate. The chamber has a radiant energy source disposed between a processing location, at which a substrate is positioned for processing, and a transportation location of the chamber at a periphery of the chamber, at which a substrate may be positioned for removing from the chamber. A substrate support has a substrate receiving surface on which a substrate may be positioned to undergo a material process. A reflector is disposed around the radiant energy source, and a gas source is disposed above the processing location of the chamber. The radiant energy source defines a radiant source plane that passes through the radiant energy source and is generally parallel to the substrate receiving surface of the substrate support. Lift pins having length sufficient to maintain the substrate at the processing location while the substrate support is positioned between the radiant source plane and the transportation location may be used to afford radiant heating of the substrate. An edge ring having a reflective surface may be disposed around the substrate support.

In one aspect, a method of processing a substrate having apertures, including trenches, formed in a first surface thereof includes depositing material on the first surface in the trenches and reflowing the material by directing energy to a second surface of the substrate opposite the first surface. A second material can then be deposited, filling the apertures partly or completely. Alternately, a cyclical deposition/reflow process may be performed to fill the apertures.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
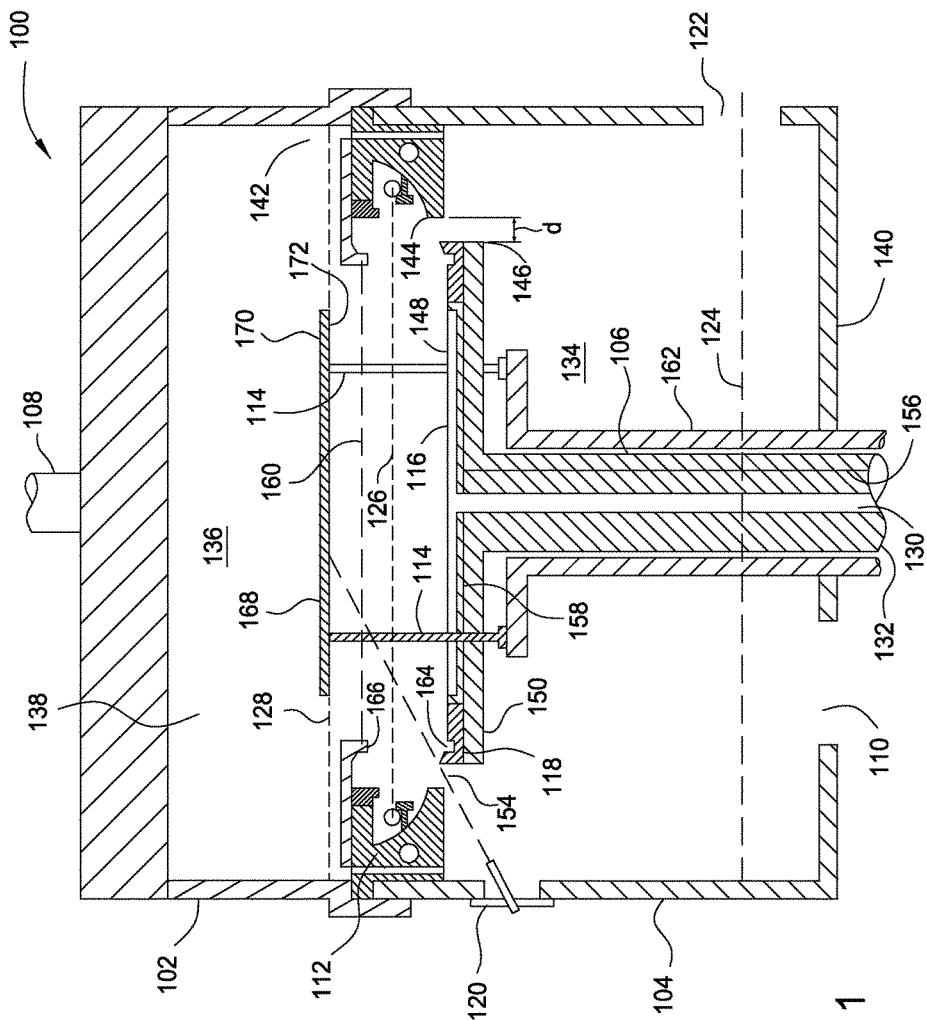
FIG. 1 is a schematic cross-sectional view of a chamber according to one embodiment.

A chamber is configured for deposition of material on a first side of a substrate and irradiation on a second side of the substrate opposite the first side of the substrate. Such a chamber is a dual-function chamber capable of performing both a material process and a thermal process on a substrate without removing the substrate from the chamber, thus eliminating the time needed to transport the substrate from a deposition chamber to an anneal chamber. The chamber has a radiant energy assembly positioned at a peripheral region of the chamber and defining a radiant source plane between a processing location and a transportation location of the chamber, a reflector disposed around the radiant energy assembly, and a gas source disposed above the processing location. FIG. 1 is a schematic cross-sectional view of a chamber 100 according to one embodiment. The chamber 100 has a wall 104 and a lid portion 102 that enclose an interior volume 138 thereof. A substrate support 106 separates the interior volume 138 into an upper volume 136 and a lower volume 134. Process gases are admitted to the upper volume 136 of the chamber through a gas an inlet 108 formed in the lid portion 102, and a substrate disposed on a substrate receiving surface 116 of the substrate support 106 is exposed to the process gases at a processing location 160 of the chamber 100. Processing gases flow across the substrate receiving surface 116 of the substrate support 106, around a peripheral portion thereof, and exit the chamber 100 through a pumping portal 110.

A shaft 132 of the substrate support 106 penetrates a lower wall 140 of the chamber, and includes a conduit 130 that provides fluid communication between a source of cooling gas (not shown) and a substrate receiving surface 116. The substrate support 106 is actuated vertically to move a substrate disposed on the substrate receiving surface 116 of the substrate support 106 between the processing location 160 and a transportation location 124 of the chamber. The transportation location 124 defines a location of the substrate at which a substrate handling apparatus (not shown) may manipulate a substrate through a portal 122.

A radiant source assembly 112 is disposed at a periphery 142 of the chamber 100 and defines a radiant source plane 126 that is between the processing location 160 and the transportation location 124. A plurality of lift pins 114 are disposed through the substrate receiving surface 116 within openings 115 of the substrate support 106 and are actuated to maintain a substrate near the processing location 160 while the substrate support 106 retracts below the radiant source plane 126. The substrate is thereby exposed to radiation from the radiant source assembly 112. In one aspect, the substrate may be positioned at a thermal processing location 128 different from the processing location 160, which may be a material processing location, by actuating the lift pins.

The radiant source assembly 112 typically surrounds the substrate support 106. An inner extent 144 of the radiant source assembly 112 is located a radial distance "d" from an outer extent 146 of the substrate support 106. The distance "d" is chosen to produce a selected irradiance of a substrate located at or near the processing location 160. By varying the distance "d" between the radiant source assembly 112 and the outer extent 146 of the substrate support 106, amount and intensity of radiation affecting the substrate may be adjusted. The distance "d" is typically substantially constant at all points of the radiant source assembly 112, and is between about 0.001 cm (i.e. 10 μm) and about 5 cm, for example between about 1 cm and about 3 cm, for a chamber configured to process 300 mm wafers. The distance "d" may also be different at different locations in the chamber 100, according to any desired design. For example, the distance "d" may be different at different points around the extent of the radiant energy assembly 112.

A shield ring 118, which may be metal or ceramic, is disposed around an edge 148 of the substrate receiving surface 116. The shield ring 118 substantially covers an outer extent 146 of the substrate support 106 to prevent deposition thereon. The shield ring 118 rests on a ledge 150 formed in the outer extent 146 of the substrate receiving surface 116. In most cases, a substrate disposed on the substrate receiving surface 116 contacts the shield ring 118. In alternate embodiments, the substrate may have an outer radius less than an inner radius of the shield ring 118, such that the substrate does not contact the shield ring 118.

In operation, the substrate support 106 moves vertically within the chamber 100, extending and retracting to various positions at different stages of processing. Fully retracted to a transportation location, the substrate receiving surface 116 is positioned near the transportation location 124 to allow a substrate handling mechanism (not shown) to deposit and retrieve substrates. The lift pins 114 are extended by actuator 162 to lift the substrate above the substrate receiving surface 116. Actuator 162 moves independently of substrate support 106 by virtue of a motor (not shown) coupled to the actuator 162. As the substrate support 106 rises from the transportation position, the lift pins 114 are retracted, so the substrate receiving surface 116 engages the substrate.

The substrate receiving surface 116 may incorporate an electrostatic chuck, which is typically a conductor 158 disposed in an insulating substrate receiving surface 116. The conductor 158 may be a plate, a wire mesh, or a single-path wire circuitously routed through the substrate receiving surface 116. Power is typically coupled to the conductor 158 through a conduit 156 disposed through the shaft 132 of the substrate support. As the substrate receiving surface 116 engages the substrate, the electrostatic chuck may be energized to immobilize the substrate on the substrate support 106. Cooling gas may also be established through the conduit 130 at that time.

The substrate support 106, with the substrate positioned thereon, moves the substrate toward the processing locations 128 and 160. The substrate support 106, with the shield ring 118 resting on the ledge 150, passes by the radiant source assembly 112 as the substrate support 106 rises toward the processing location 160. When the substrate receiving surface 116 reaches the processing location 160, the substrate may be subjected to a material process, such as deposition, implant, or etch. The shield ring 118 may have a notch 164 for engaging a cover ring 166, which may be metal or ceramic, extending outward from the shield ring 118 toward the lid portion 102. The cover ring 166 and notch 164 improve the function of the shield ring 118 by controlling gas flow from the upper volume 136 past the cover ring 166 into the lower volume 134. The notch 164 and barrier 166 are optional. As the substrate support 106 moves toward the processing locations 160 and 128, the shield ring 118 engages the cover ring 166. As the substrate support 106 moves toward the processing location 128 from the processing location 160, the cover ring moves with the shield ring 118 and the substrate support 106

In some embodiments, an edge support may be provided that extends inward from the sidewall 104 at a point between the radiant source assembly 112 and the transportation location 124. The edge support (not shown) may be configured to engage the shield ring 118 as the substrate support 106 moves toward the transportation location 124. In such an embodiment, the ledge 150 has an outer radius less than an outer radius of the shield ring 118, such that a portion of the shield ring 118 extends beyond the outer extent 146 of the substrate support 106. Such a configuration enables removing the shield ring 118 from the substrate support 106 to improve access to the substrate receiving surface 116 at the transportation location 124.

After processing at the processing location 160 is complete, the substrate support 106 may be positioned for back-side thermal processing of the substrate. Any chucking of the substrate is disengaged by interrupting power to the conductor 158 (or vacuum to the substrate receiving surface in a vacuum chuck embodiment), the substrate support 106 retracts, and the lift pins 114 are actuated into an extended position. This disengages the substrate from the substrate receiving surface 116, and maintains the substrate at the processing location 160 as the substrate support 106 retracts to the thermal processing position below the radiant source plane 126. The substrate back side is thereby exposed to radiation from the radiant source assembly 112. If desired, the substrate may be moved to a thermal processing location 128 different from the processing location 160 by actuating the lift pins. In such embodiments, the processing location 160 may be a material processing location. It should be noted that a thermal processing location may be above or below the material processing location, as desired depending on the energy exposure needs of specific embodiments. A substrate 168 is shown in FIG. 1 in a thermal processing position.

During thermal processing, the radiant source assembly 112 is powered, and energy radiates from the radiant source assembly 112 toward the substrate 168. The "back side" of the substrate 168, meaning the substrate surface 172 opposite the surface 170 on which a material process was performed, is irradiated in this fashion. Besides providing an integrated material and thermal processing chamber, irradiating the back side 172 of the substrate 168 in this fashion may improve energy efficiency of the thermal process by irradiating a less reflective surface of the substrate 168. In some embodiments, the material process performed on the substrate 168 forms a reflective layer or partial layer on the surface 170 that reduces energy absorption. Irradiating the back side 172 avoids the increased reflectivity. Moreover, the reflectivity of the surface 170 may reflect radiation from the radiant source assembly 112 that travels through the substrate 168 back through the substrate 168 for further efficiency improvement.

In some embodiments, position of the substrate 168 during thermal processing may be modulated to improve uniformity of radiation on the substrate 168. The substrate 168 may be moved further up or down from the thermal processing location 128 cyclically by actuating the lift pins 114 to move any non-uniformities in the radiation pattern to various locations on the back side 172, thus reducing the impact of the non-uniformity and/or substrate bending on substrate processing. Maximum deviation of the back side 172 from the thermal processing location 128 may be expressed as a ratio to substrate thickness. The elevation ratio may vary between about 0.1 and about 100 substrate thicknesses.

When the substrate support 106 is at a thermal processing location, as shown in FIG. 1, a thermal sensor 120 senses a thermal condition of the substrate 168, positioned above the substrate receiving surface 116 on extended lift pins 114, by line-of-sight through a gap 154 between the radiant source assembly 112 and the shield ring 118. In embodiments omitting the shield ring 118, the gap 154 will be between the radiant source assembly 112 and the outer extent 146 of the substrate support 106. The thermal processing location may therefore be defined by the desired gap 154 between the radiant source assembly 112 and the shield ring 118 or the outer extent 146 of the substrate support 106 and the inner extent 144 of the radiant source assembly 112.

After thermal processing is complete, the substrate is typically re-engaged with the substrate receiving surface 116 by retracting the lift pins 114. Chucking may be re-applied, and cooling gas re-established to cool the substrate. The substrate support 106 may then be moved into position for further processing, if desired, or back to the transportation location for retrieval of the substrate. When the substrate support 106 is positioned at the transportation location, access to the substrate is provided by extending the lift pins 114 so that a robot blade may be inserted between the substrate and the substrate receiving surface 116.

Figure 2A:
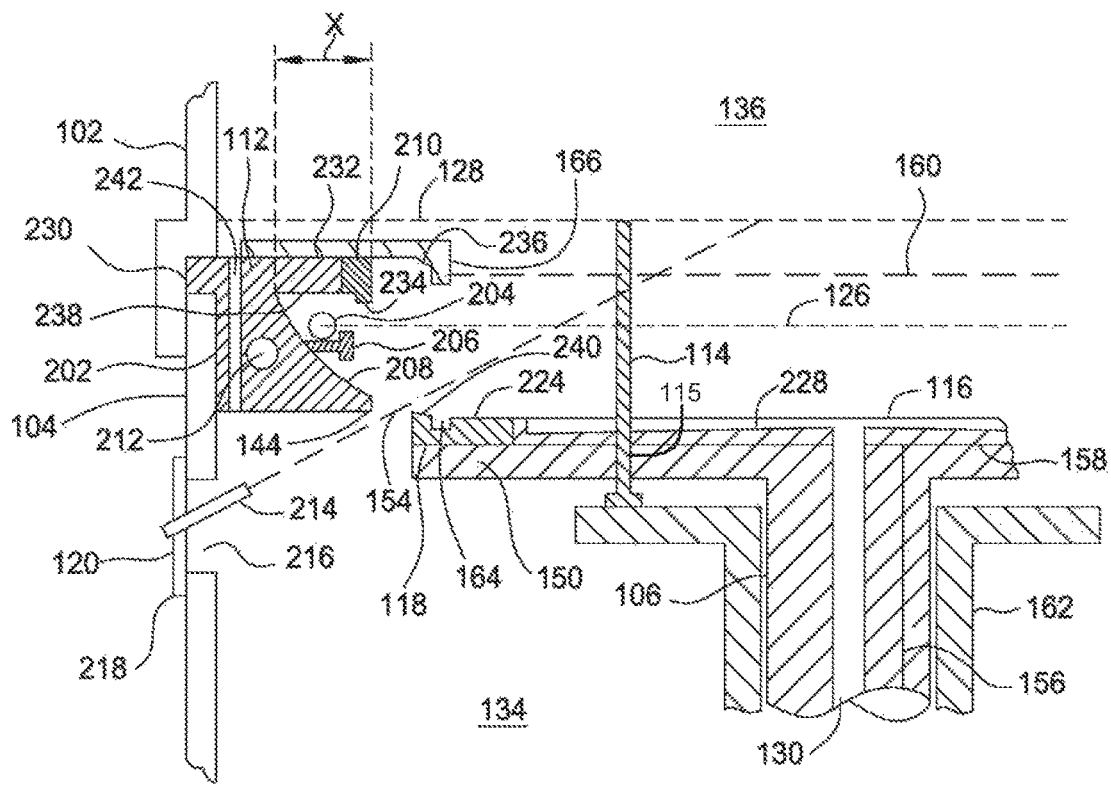
FIG. 2A is a detailed view of a portion of the chamber of FIG. 1.

FIG. 2A is a detailed view of the chamber 100 showing the relationship of the substrate support 106 and the radiant source assembly 112. The radiant source assembly 112 is supported from the chamber wall 104 by an extension 230 between the chamber wall 104 and the lid portion 102. The radiant source assembly 112 includes a housing 202, a radiant energy source 204, at least one support 206 that protrudes from the housing 202 and supports the radiant energy source 204, and a reflective surface 208. The housing 202 is generally made of a thermally conductive material, such as metal, for example stainless steel. A channel 212 within the housing 202 enables circulation of a cooling medium, gas or liquid. The support 206 may be a thermally conductive material, such as metal, for example stainless steel, or a refractive material such as ceramic. The radiant energy source 204 may be a lamp producing radiation at wavelengths from the infrared to the violet, or a microwave, millimeter wave, terahertz wave, submillimeter wave, or far-infrared source. The radiant energy source 204 may produce radiation having wavelengths from about $5\times10^{-2}$ m to about $1\times10^{-7}$ m. Exemplary radiant energy sources include heat lamps, halogen lamps, arc lamps, and coaxial microwave or millimeter wave sources.

The housing 202 features a plurality of conduits 242 extending through the housing 202. The conduits 242 enable gas flow from the upper volume 136 to the lower volume 134 during processing and during chamber pump-down operations.

The reflective surface 208 of the housing 202 is shaped to reflect radiation from the radiant energy source 204 toward the back side of a substrate positioned at the processing locations 128 or 160. In some embodiments, the reflective surface 208 is shaped to allow substantially uniform irradiation of the substrate. The reflective surface 208 may have any desired shape, such as cylindrical, torroidal, elliptical, oval, or an irregularly curved shape. The reflective surface 208 may be faceted in addition to, or instead of, being curved. In one embodiment, the reflective surface 208 may be joined segments of cylinders having the same or different radii of curvature, each of which may also be tapered or faceted in part. In one embodiment, the reflective surface 208 is a half-torroid. In another embodiment, the reflective surface 208 comprises a plurality of reflective pieces, each of which may independently be substantially flat, curved, tapered, or faceted, the reflective pieces positioned so as to approximate a curved surface. The supports 206 are typically discontinuous, for example support pins, rods, or bumps, so radiation from the radiant energy source 204 reaches substantially all extents of the reflective surface 208 and reflects toward the substrate.

An upper portion 232 of the housing 202 extends radially inward from the reflective surface 208 a distance "x" selected based on two considerations. First, for embodiments that omit the barrier 166, the distance "x" is selected to provide a desired space between the shield ring 118 and the upper portion 232 while the substrate support 106 is deployed in its uppermost processing position. In such embodiments, the space between the shield ring 118 and the upper portion 232 influences the extent to which deposition materials may pass into the lower volume 134 and deposit on chamber surfaces therein. Second, the distance "x" is selected to shadow a portion of the substrate closest to the radiant energy source 204 during thermal processing to avoid excessive radiation thereon. The upper portion 232 may have an extension 210 with a projection 234 provided to intercept a desired amount of radiation coming from the radiant energy source 204. The extension 210 may be made of a refractory material, such as ceramic, in some embodiments, due to its relative proximity to the radiant energy source 204 and the channel 212. In other embodiments, the extension 210 may be formed from a material having desired optical properties with respect to the emitted radiation, such that radiation may be selectively blocked, transmitted, or absorbed and re-emitted. The inner radius of the extension 210 may be about the same as the inner radius 144 in some embodiments, as measured from a central area of the chamber 100. In some embodiments, the distance "x" and the projection 234 may be configured to block line-of-sight from the radiant energy source to any part of the substrate positioned at the processing locations 128 and 160. For a chamber configured to process 300 mm wafers, the upper and lower portions of the housing extend from the chamber wall 104 between about 1 cm and about 6 cm, depending on the configuration of the radiant energy source 204. In one embodiment, the upper and lower portions of the housing extend about 2 cm from the chamber wall.

Other methods may be used to reduce direct lighting of the substrate by the radiant energy source 204. In one embodiment, a surface of the radiant energy source 204 facing toward the substrate, for example a surface facing away from the housing 202 or the reflective surface 208, may be coated with a coating configured to reduce or eliminate direct line-of-sight radiation incident on the substrate. The coating may be reflective in some embodiments, such that light from the radiant energy source 204 incident on the coating is reflected toward the reflective surfaces of the housing 202, such as the reflective surface 208. In other embodiments, the coating may be absorptive, translucent, opaque, black, or white. In some embodiments, the coating may be metal or ceramic. The coating is generally selected to withstand the thermal environment of the radiant energy source 204. Use of a coating, optionally in combination with the projection 234 of the extension 210 and the upper portion 232, may ensure that all light reaching the substrate during a thermal process is reflected light. In some embodiments, use of a coating may eliminate the need for the upper portion 232 of the housing 202 by eliminating the potential for direct lighting of the substrate surface by emitted radiation.

The shield ring 118 may have an upper surface 224 configured to reflect radiation from the radiant energy source 204 toward the substrate positioned at the processing location 160. A contoured portion 240 of the shield ring 118 may be raised, angled, or curved to cast reflected radiation toward the substrate. The barrier 166 may have a contoured portion 236 that is shaped to match the shape of the contoured portion 240 of the shield ring 118. The contoured portion 236 may be curved, angled, or tapered in matching relationship to the contoured portion 240 of the shield ring 118 to ensure control of any gas flow through the notch 164 and around the barrier 166.

The shield ring 118 may be metal, for example stainless steel, or metal-coated ceramic. In general, the shield ring 118 is formed from materials resistant to high temperature processing, and the surface 224 of the shield ring 118 is reflective. The shield ring 118 may be a ceramic coated with a reflective metal such as silver, or the shield ring 118 may use a dielectric mirror, such as layered ceramics having different refractive indices. The upper surface 224 of the shield ring 118 may be curved and/or faceted in a way that is compatible with the curvature and/or faceting of the reflective surface 208, such that the reflective surface 208 and the upper surface 224 of the shield ring 118 together form a composite reflector configured to direct as much radiation as possible, as uniformly as possible, from the radiant energy source 204 to the substrate back side positioned above the radiant energy source 204.

The thermal sensor 120 includes a spectral sensor 214 disposed through an opening 216 in the chamber wall 104. A plate 218 secures the spectral sensor 214 in the desired position for viewing the back side of the substrate at the processing location 160 through the gap 154. The spectral sensor 214 may be a pyrometer. In one embodiment, the spectral sensor 214 would be a pyrometer attuned to measure the intensity of radiation having wavelength of about 1 μm. In another embodiment, a pyrometer may operate in the wavelength region of about 7-15 μm.

Figure 2B:
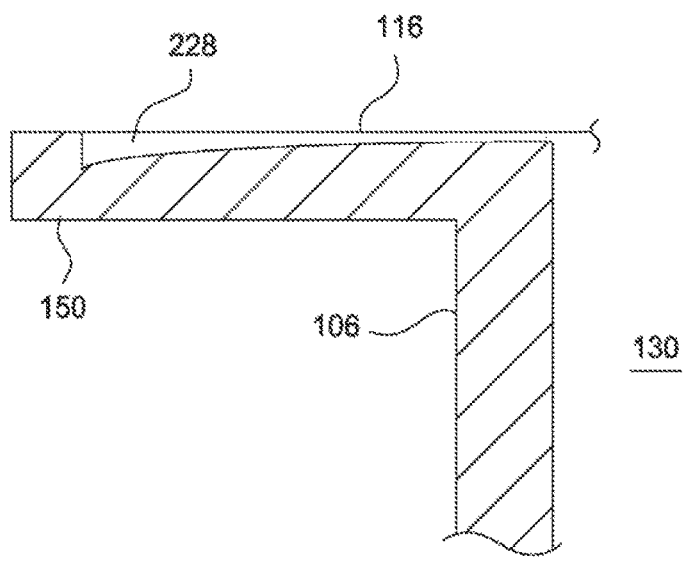
FIG. 2B is a close-up view of a substrate support according to another embodiment.

Channels 228 are formed in the substrate receiving surface 116 of the substrate support 106 to facilitate bringing a cooling medium into contact with a substrate disposed on the substrate receiving surface 116. The channels 228 are in fluid communication with the conduit 130. A cooling medium, for example a cooling gas, is provided through the conduit 130 to the channels 228, flowing from the center to the edge of the substrate receiving surface 116. The channels 228 may have a depth that increases from the center to the edge of the substrate receiving surface 116 to facilitate fluid flow. The increasing area for fluid flow counteracts the expansion of the cooling medium with heating. Expansion of the cooling medium creates pressure that impedes flow to the periphery of the substrate receiving surface 116. The graduated depth of the channels counteracts the impedance. The channels may be designed with any useful depth profile, depending on the exact cooling profile desired. In one embodiment, the channel depth increases linearly with distance from the center of the substrate receiving surface 116. In such an embodiment, the flux area of fluid flow also increases linearly. In another embodiment, the depth of channels 228 may increase with the square of distance from the center of the substrate receiving surface 116. FIG. 2B is a close-up view of a substrate support such as the substrate support 106 of FIG. 1, with channels 228 that have a depth increasing with the square of distance from the center of the substrate receiving surface. In another embodiment, the depth of channels 228 may be configured for approximately constant mass flux from the center to the edge of the substrate receiving surface 116.

The substrate receiving surface 116 may be reflective. A dielectric mirror surface is provided in one embodiment. In other embodiments, a reflective metal, such as silver, is applied over a ceramic material, or under a transparent material. The reflective material may be extended into the fluid flow recesses in a conformal fashion. For example a reflective liner may be applied to the fluid flow recesses, if desired. Any known conformal process may be used to form a conformal reflective surface, if desired. In another embodiment, the reflective material may be applied only to the fluid flow recesses, for example by depositing the reflective material conformally and removing the reflective material from the flat surfaces between the recesses, either by physical means such as polishing or by chemical means such as etching.

A reflective substrate receiving surface 116 may be configured to selectively reflect radiation likely to be absorbed by the substrate 168. For example, in one embodiment, a dielectric mirror configured to reflect radiation having a wavelength between about 0.2 μm and about 1.0 μm may be useful. Such a dielectric mirror may be fashioned by forming alternating layers having different refractive indices on the substrate receiving surface 116.

Figure 2C:
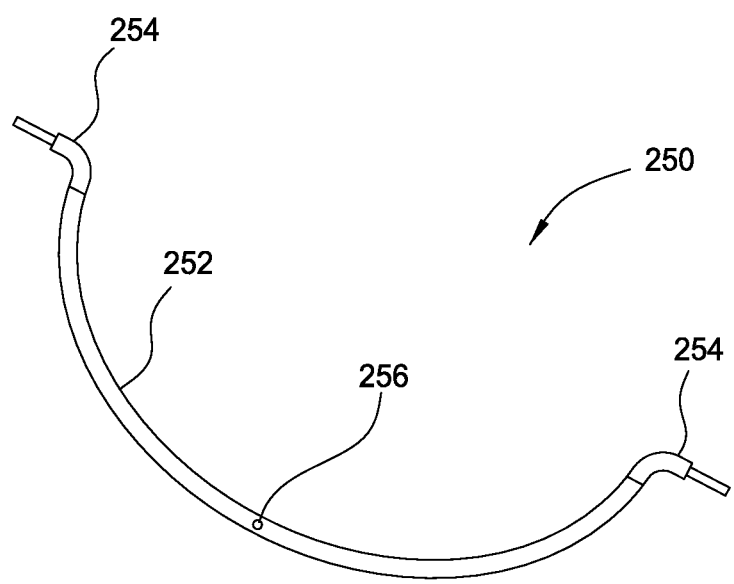
FIG. 2C is a perspective view of a radiant source that may be used in the chamber of FIG. 1.

FIG. 2C is a perspective view of a radiant energy source 250 that may be used as the radiant energy source 204 in the embodiments of FIG. 2A. The radiant energy source 250 is semi-circular for use in a substantially cylindrical chamber for processing circular substrates. The radiant energy source 250 is a halogen lamp with a radiant section 252 and two connectors 254, one at each end of the lamp. The connectors 254 are configured to project through an opening in the housing 202, and chamber wall 104 described above with respect to FIG. 2A, for connection to a power source (not shown). Typically, a conductor is disposed around the outside of the chamber wall to deliver power to the connectors 254. Two such radiant energy sources 250 will generally be used in one chamber, opposed to one another, to produce uniform radiation throughout. In one embodiment, the radiant energy source 250 is a 7.5 kW, 480 V incandescent or halogen incandescent Osram lamp. In another embodiment, the radiant energy source 250 is a Xenon discharge lamp. The radiant energy source 250 may have a contact area 256 for contacting a support such as the support 206 of FIG. 2A. The contact area 256 may be a thermally insulating pad to reduce direct heating of the support 206 from contact with the radiant energy source 250.

The radiant energy sources depicted herein as 204 and 250 are suggested to be substantially coplanar with the substrate receiving surface 116, defining a radiant source plane 126. It should be noted that in some embodiments, it may be advantageous to use radiant sources having displacement elements transverse or perpendicular to the substrate receiving surface 116. Such radiant sources may serve to add power to the radiant source by adding linear distance over which radiation emission occurs. In one embodiment, a plurality of straight elongated radiant sources may be disposed in an orientation perpendicular to the substrate receiving surface 116. In another embodiment, a radiant source may feature an alternating transverse displacement (i.e. a wave pattern). In such embodiments, the housing, and the reflective surfaces thereof, may be optimized for the specific radiation patterns produced. In other embodiments, a lamp may comprise a plurality of joined linear segments forming a polygonized lamp. In other embodiments, the radiant source may be a plurality of linear lamps arranged in a coplanar fashion around the periphery of the chamber in a plane substantially parallel to the substrate receiving surface 116 of the substrate support 106, the major axis of each lamp substantially parallel to the substrate receiving surface 116. In other embodiments, a plurality of such planes of lamps may be used, each plane displaced from the other in a direction perpendicular to the substrate receiving surface 116. In other embodiments, a spiral or helical lamp may be used, optionally in conjunction with other lamp formations discussed above.

In other embodiments, a plurality of u-shaped lamps may be used, wherein the straight parts of the u-shape extend substantially parallel to the substrate receiving surface, and the ends of one u-lamp are positioned proximate the ends of another u-lamp such that the electrical contacts of two adjacent lamps penetrate the housing and chamber wall in as small an area as possible to minimize disruption of the reflective surface of the housing. Such lamps may easily be connected in series by connecting the electrical outlet of one lamp to the electrical inlet of an adjacent lamp. In embodiments featuring multiple sources disposed around the periphery of the chamber, each source may have a discrete reflector and housing, or one reflector and housing may be provided for a group of sources, up to and including a single reflector and housing for all sources. In one embodiment, two radiant sources are used.

Referring again to FIG. 2A, the upper portion 232 of the housing 202 has a lower surface 238 that is depicted generally parallel to the substrate receiving surface 116. The lower surface 238 may be reflective to improve efficiency of the radiant source assembly 112. In one embodiment, the lower surface 238 is sloped with respect to the substrate receiving surface 116 such that the distance between the lower surface 238 and the substrate receiving surface 116 decreases with radial distance from the chamber wall 104. This slope may be linear or non-linear, and may provide increased radiation to the substrate surface from the radiant energy source 204. In one embodiment, the slope of the lower surface 238 is linear, and forms an angle with the substrate receiving surface 116 that is between about 1° and about 10°, such as between about 3° and about 7°, for example about 5°. In other embodiments, the lower surface 238 may be curved according to any convenient design. The lower surface 238 may have a single radius of curvature or focal point, or may have multiple radii of curvature or focal points. In one example, the lower surface 238 may be approximately cylindrical, with a focal region that substantially coincides with a discharge coil or filament of the lamp. Reflected radiation from the lower surface 238 may help raise the temperature of the discharge coil to an operative range such that less electrical energy is needed to achieve a desired radiant output power. In other embodiments, the lower surface 238 may be configured to direct or focus reflected radiation away from the lamp and toward the surface 208 for reflection up to the substrate. In other embodiments, the lower surface 238 may be cusped to reflect radiation to multiple points within the housing 202 or to the substrate support 106 or shield ring 118.

It should be noted that the substrate need not be positioned at the same location for material (i.e. deposition or implant) and thermal processing. In the foregoing description, it is suggested that the processing location 160 is the same during material and thermal processing, but it is not required to be so. For example, a thermal processing location may be different from a material processing location. The substrate may be raised or lowered from a material processing location to a thermal processing location. The location of the thermal processing location with respect to the material processing location generally depends on design of the radiant source and the needs of the material process.

The chamber 100 may be a PVD chamber in one embodiment. In such an embodiment, the lid portion 102 of the chamber 100 will include a sputtering target, magnetron, and gas feed system as is known in the art. In an alternate embodiment, the chamber 100 may be a CVD chamber, PECVD chamber, or etch chamber, with a showerhead or showerhead electrode disposed in the lid portion 102 as is known in the art. In another embodiment, the chamber 100 may be a P3i chamber with an inductive plasma source disposed in, or coupled to, the lid portion 102, as is known in the art. A radiant source assembly such as the radiant source assembly 112 may be used in any processing chamber desirous of integrated thermal processing.

Figure 3:
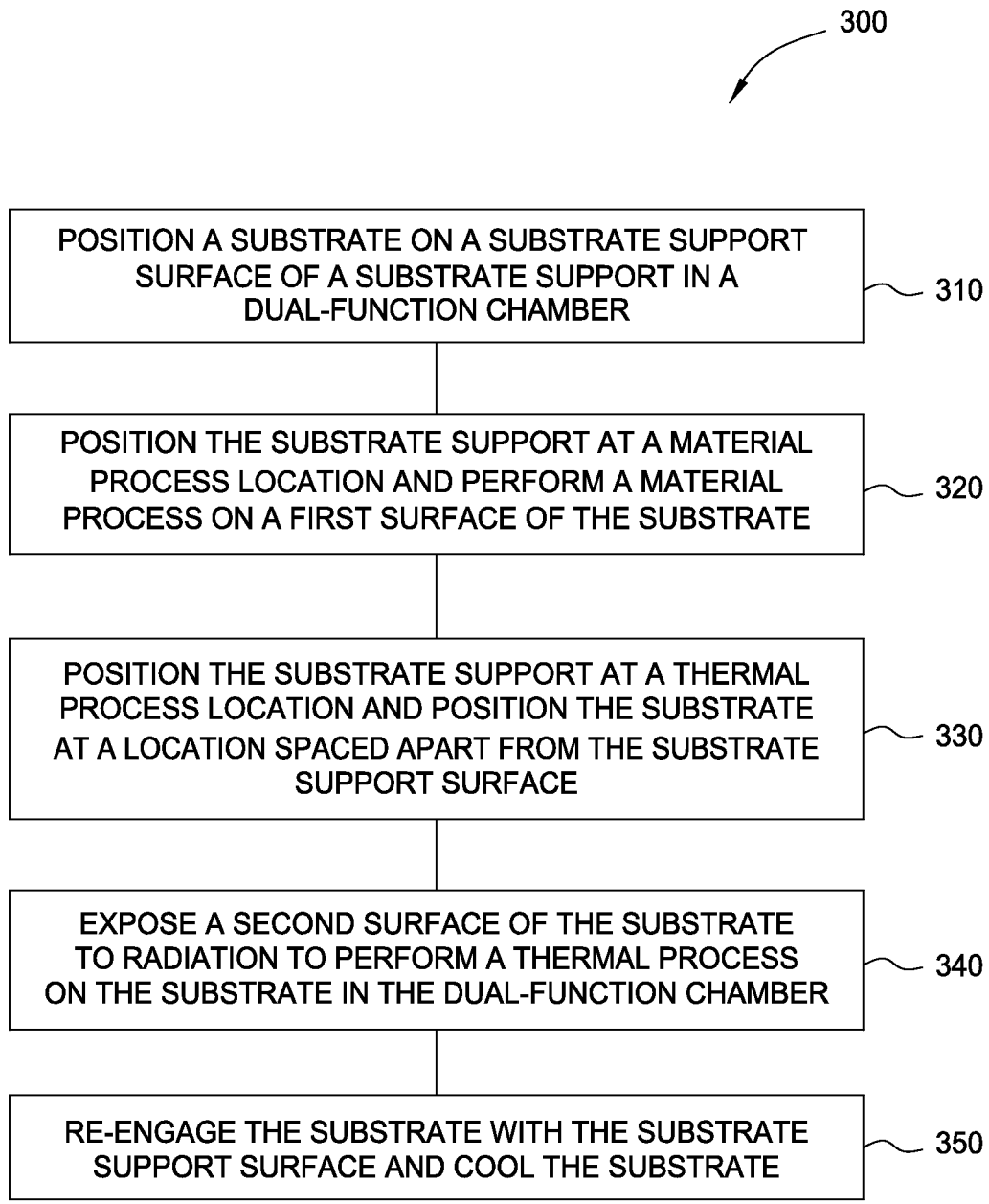
FIG. 3 is a flow diagram summarizing a method according to another embodiment.

FIG. 3 is a flow diagram summarizing a method 300 according to another embodiment. The method 300 utilizes a dual-function chamber as described in any of the foregoing embodiments to accomplish a material process (i.e. deposition, etch, and/or implant) and a thermal process in a single chamber. At 310, a substrate is disposed on a substrate support surface in the chamber. At 320, the substrate is positioned at a material process location, and a material process is performed on a first surface of the substrate. At 330, the substrate is separated from the substrate support surface by a space. At 340, a thermal process is performed by exposing a second surface of the substrate, opposite the first surface, to a radiant energy source disposed around a periphery of the substrate support. At 350, the substrate is re-engaged with the substrate support and cooled. The entire method 300 may be repeated any desired number of times to perform a cyclical material/thermal process in a single chamber. Additionally the material and thermal operations may be repeated independently, if desired, the same number of times or different numbers of times.

In one embodiment, the material process of 320 is a PVD process for depositing metal on a substrate. A sputtering gas is provided to the chamber in the lid portion thereof. A sputtering target disposed in the lid portion is energized with RF or DC electric power to form a plasma. The plasma sputters material onto the substrate from the target. In the case of a metal fill process, a barrier layer such as TiN or TaN is deposited in the features to be filled prior to metallization. In the case of silicidation, the barrier layer is omitted, and metal is deposited directly on silicon. In the case of a metal deposition process, the thermal process performed at 320 may be a reflow process to reduce overhang of metal in recesses of the substrate, or a silicidation process to drive reaction between metal and silicon. In one PVD embodiment, a copper target is sputtered by an argon sputtering gas provided at a flow rate between about 200 sccm and about 20,000 sccm, depending on the deposition rate required and the substrate size. RF power between about 100 W and about 10,000 W is applied to the target.

Following the metal deposition process, the substrate is heated at 330 from a first temperature profile to a second temperature profile at a ramp rate between about 10° C./sec and about 20° C./sec, such as between about 15° C./sec and about 17° C./sec, for example about 16.2° C./sec. The first temperature profile features an average temperature between about 20° C. and about 200° C., for example about 50° C., with uniformity within about 5° C.

The heating method described herein has advantages with respect to a metal deposition process. When metal is deposited on a substrate surface, the surface gains reflectivity. Absorption of radiant energy is generally reduced on a metalized surface, so irradiating the metalized surface is less effective than heating the surface opposite the metalized surface, for example the substrate back side. Improved energy absorption of silicon, for example, over metal improves energy efficiency of the thermal treatment process.

For a copper reflow process, the second temperature profile features an average temperature between about 250° C. and about 350° C., such as between about 275° C. and about 325° C., for example about 320° C., with a uniformity with about 20° C., for example within about 15° C. The temperature is ramped up over a period between about 10 sec and about 30 sec, such as between about 15 sec and about 25 sec, for example about 20 sec. The second temperature profile is substantially maintained for a period between about 0 sec and about 30 sec after heating up, such as between about 5 sec and about 25 sec, for example about 20 sec, to accomplish the reflow process. Such a method may be used for deposition and reflow of different materials using different temperatures and times, as necessary. A chamber such as the chamber 100 may be used, with minimal adaptation, for such a method.

In some embodiments, the substrate temperature is ramped up by applying a first power setting to the radiant source, and then upon reaching a target temperature, the temperature is held substantially constant by applying a second power setting to the radiant source. In one embodiment, the first power setting is about 90% of the rated power of the radiant source, and the second power setting is about 10% of the rated power of the radiant source. In the case of the 7.5 kW Osram lamps referred to above, a 90% power setting would apply about 6.75 kW of power to each lamp, and a 10% power setting would apply about 750 W to each lamp. Depending on the type of radiant source used and the thermal operation being performed, the duty cycle for heat-up will be between about 60% and about 95%, and the duty cycle for maintaining temperature will be between about 5% and about 30%.

The substrate is cooled at 340 to a third temperature profile having an average temperature below about 50° C. over a duration between about 30 sec and about 120 sec, such as about 60 sec. During cooling, the maximum temperature non-uniformity across the substrate is kept to less than about 55° C. to minimize thermal stress on the substrate. This may be accomplished using the substrate support described above in connection with FIGS. 1 and 2A. In one embodiment, the maximum temperature non-uniformity is less than about 50° C.

In a metal deposition process, the operations of depositing metal and reflowing, as described above, may be repeated any number of times in a single chamber to achieve filling openings in a patterned substrate with metal. Such a cyclical reflow process achieves fast void-free filling of recesses. In most embodiments, the deposition and thermal process is repeated five times or less. In one example, the deposition and thermal process is performed three times. In some embodiments, a conventional barrier lay may be formed over the substrate prior to beginning a filling process as described above. The barrier layer reduces the tendency of metal to migrate into the substrate during successive deposition and thermal processes.

In a silicide process, the peripheral radiant source described above may be used to heat a substrate to a temperature between about 150° C. and about 500° C. to promote reaction between silicon and deposited metals such as cobalt and molybdenum. Deposition and thermal treatment may be performed repeatedly in cycles for silicidation, also.

In another embodiment, the method 300 may be a nitridation and reoxidation process. A plasma nitridation process, such as a DPN process, may be performed by exposing a substrate to a nitrogen plasma. A reoxidation process may then be performed in the same chamber, using a multi-functional material/thermal chamber as described herein, by positioning the substrate for thermal processing and activating a radiant energy source positioned to irradiate the substrate surface opposite the surface exposed to the nitrogen plasma. An oxidizing atmosphere, such as an atmosphere comprising oxygen radicals, may be provided during the thermal process. The cyclical nitridation/reoxidation process may be repeated any desired number of times.

The chamber 100 described above in connection with FIGS. 1-2B is a dual-function chamber that performs a material process and a thermal process on a substrate in a single chamber. Such a dual-function chamber is useful for processes that feature a material process followed by a thermal process. Such processes include, but are not limited to, metal deposition and reflow, silicidation, deposition (CVD, ALD, PECVD, epitaxy) and anneal, implant and anneal, and plasma nitridation and reoxidation. Such processes may be performed in a single chamber by coupling a peripheral radiation source, substantially as described above, to a chamber that performs the material process.

Figure 4:
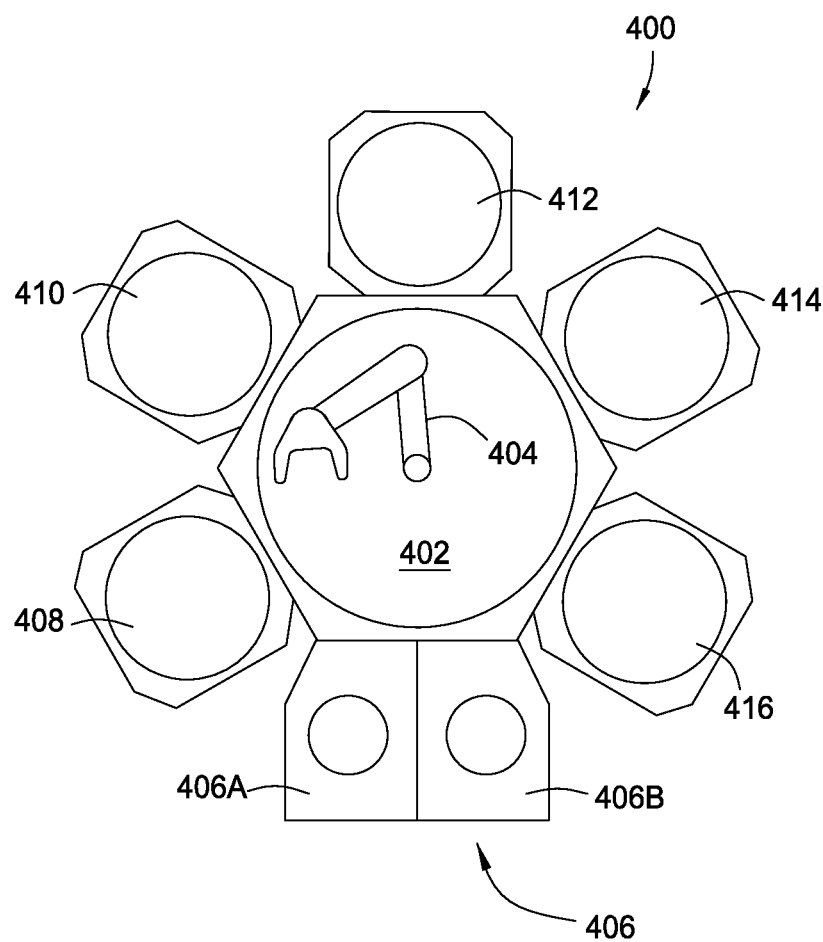
FIG. 4 is a plan view of a cluster tool according to another embodiment.

FIG. 4 is a plan view of a cluster tool 400 according to another embodiment. The cluster tool 400 features at least one dual-function material/thermal chamber, as described above. An example of the cluster tool 400 is the CENTURA® system available from Applied Materials, Inc., of Santa Clara, Calif. Cluster tools manufactured by others may be used as well. A transfer robot 404 of any convenient type is disposed in a transfer chamber 402 of the cluster tool. A load-lock 406, with two load-lock chambers 406A/B, is coupled to the transfer chamber 402. A plurality of process chambers 408, 410, 412, 414, and 416 are also coupled to the transfer chamber 402. In a conventional cluster tool, one or more process chambers may be a thermal process chamber, such as an anneal, degas, or oxidation chamber. Using a dual-function chamber, as described herein, the thermal chamber may be eliminated and production rate increased.

In one embodiment, the cluster tool 400 may be a logic gate formation tool. Chamber 408 may be a silicon deposition chamber, which may be PVD or CVD, and may be plasma enhanced. Chamber 410 may accordingly be a dual-function plasma nitridation and thermal treatment chamber. Chamber 412 may be devoted to oxide formation, nitridation/thermal treatment, or silicon formation, as needed to maximize production rate. Because no single chamber is devoted to thermal processing alone, production rate may be increased by using dual-function material/thermal chambers. In another embodiment, any of chambers 408, 410, 412, 414, and 416 may be a combined plasma cleaning and reoxidation chamber.

Figure 5:
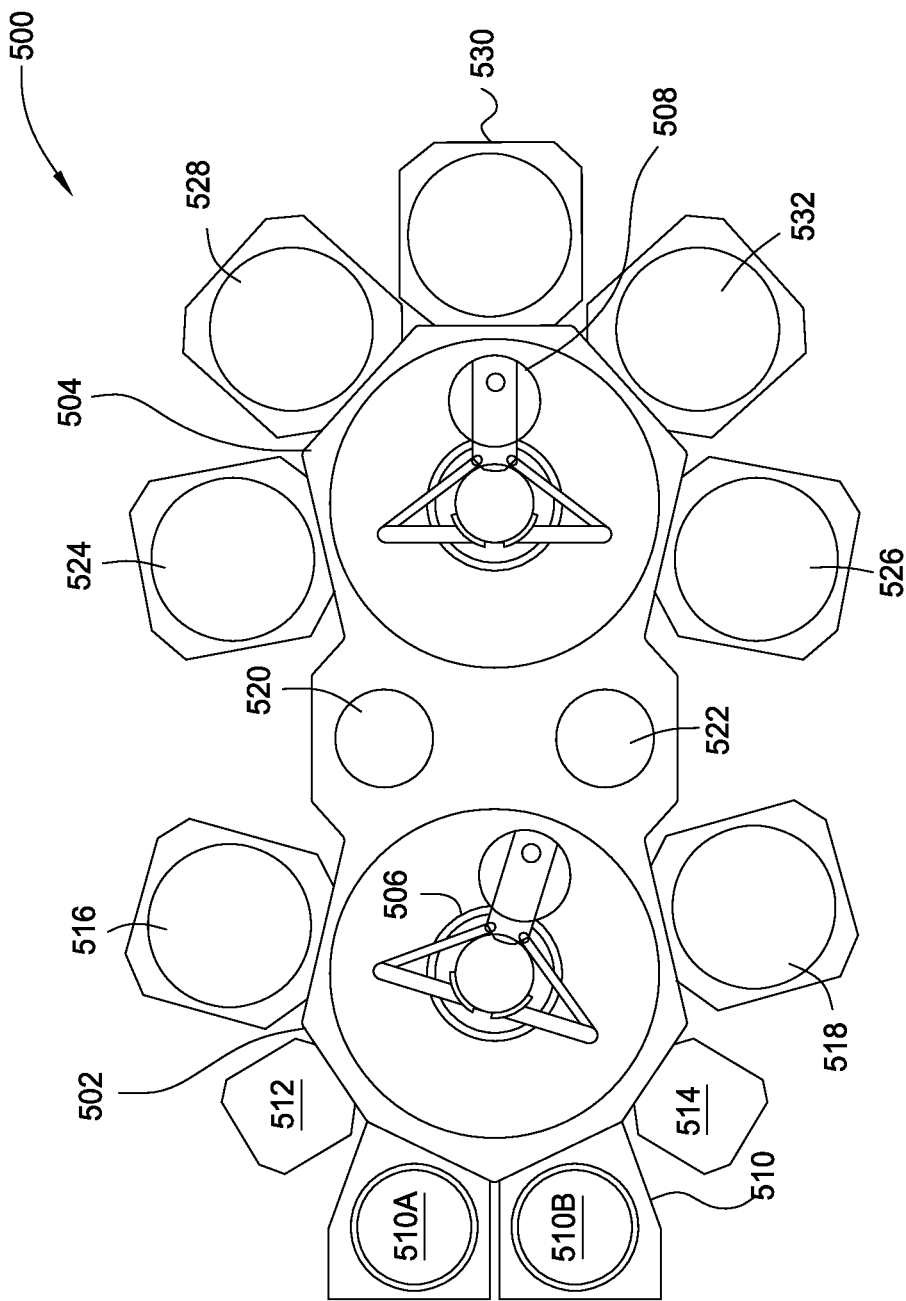
FIG. 5 is a plan view of a cluster tool according to another embodiment.

FIG. 5 is a plan view of a cluster tool 500 according to another embodiment. The cluster tool 500 features a plurality of processing chambers coupled to two transfer chambers 502 and 504. An example of the cluster tool 500 is the ENDURA® system of Applied Materials, Inc. Cluster tools manufactured by others may be used as well. Each of the transfer chambers 502 and 504 has a transfer robot 506 and 508, respectively. A load-lock 510, featuring two load-lock chambers, 510A/B, is coupled to the first transfer chamber 502. Substrates are passed between the transfer chambers using pass through chambers 520 and 522, which are accessible to both transfer robots 506 and 508.

In a typical configuration, any or all of the processing chambers 524, 526, 528, 530, and 532 may be dual-function deposition/thermal process chambers, with deposition by CVD, PVD, or ALD processes, which may be plasma enhanced, according to the configuration of the lid portions thereof. In one embodiment, process chambers 524 and 526 are PVD chambers for forming a barrier layer, and chambers 528, 530, and 532 are dual-function PVD metal deposition/reflow chambers, each capable of performing a process similar to the process of FIG. 3. Chambers 516 and 518 may be pre-clean chambers, and chambers 512 and 514 may be degas, cooling, or surface passivation chambers. Any of the chambers 516, 518, 524, 526, 528, and 532 may be combined plasma clean and reoxidation chambers.

While the foregoing is directed to embodiments of the invention, other and further embodiments of the invention may be devised without departing from the basic scope thereof.

What is claimed is:

1. A chamber for processing substrates, comprising:
a chamber body defining a processing region and an inlet for process gases;
a sputtering target disposed in the chamber;
a radiant energy source positioned at a peripheral region of the chamber to provide radiant energy between a processing location and a transportation location of the chamber; and a reflector that is annular and mounted to a sidewall of the chamber, the reflector having:
a lower portion having at least one support for the radiant energy source and a concave inner surface disposed around the radiant energy source, the concave inner surface consisting of a reflective surface;
an upper portion having a planar lower surface disposed above the radiant energy source, the planar lower surface consisting of a reflective surface that is parallel to a substrate receiving surface; and
wherein the concave inner surface is configured to reflect radiation from the radiant energy source and from the planar lower surface to the processing location.

2. The chamber of claim 1, wherein the radiant energy source comprises two semicircular arc lamps.

3. The chamber of claim 1, further comprising a substrate support coupled to a vertical actuator and a lift pin assembly coupled to the substrate support and extending through a substrate receiving surface thereof, wherein the lift pin assembly comprises a plurality of lift pins each having a length sufficient to maintain a substrate at the processing location while the substrate receiving surface of the substrate support is positioned between the radiant energy source and the transportation location.

4. The chamber of claim 1, wherein the reflector comprises a radial extension protruding between the radiant energy source and peripheral portions of the processing location inside the chamber.

5. The chamber of claim 1, further comprising a substrate support with an edge ring having a reflective surface.

6. The chamber of claim 1, further comprising a substrate support with an edge ring having a reflective surface that is angled with respect to the substrate receiving surface of the substrate support.

7. The chamber of claim 5, wherein the substrate support has the substrate receiving surface having channels therein, and a depth of one or more of the channels increases with distance from a center of the substrate support.

8. The chamber of claim 1, wherein the radiant energy source has a coating on a surface of the radiant energy source facing away from the reflector.

9. The chamber of claim 8, wherein the coating is reflective.

10. A chamber for processing a single substrate, comprising:
a chamber body defining a processing region;
a sputtering target disposed at least partially within the chamber body;
a substrate support movably disposed inside the chamber to move between a processing location and a substrate transportation location, the substrate support defining a substrate receiving surface having a plurality of channels formed therein and the substrate support comprises a plurality of openings formed therethrough;
a lift pin assembly coupled with the substrate support, the lift pin assembly comprising a plurality of lift pins movably disposed through the openings in the substrate support;
a radiant energy source disposed within the processing region of the chamber that defines a radiant source plane that is disposed between the processing location and the substrate transportation location;
and an annular reflector, the annular reflector mounted to a sidewall of the chamber, the annular reflector having:
a lower portion having at least one support for the radiant energy source and a concave inner surface that at least partially surrounds the radiant heat source, the concave inner surface consisting of a reflective surface;
an upper portion having a planar lower surface disposed above the radiant energy source, the planar lower surface consisting of a reflective surface that is parallel to the substrate receiving surface; and
wherein the concave inner surface is configured to reflect radiation from the radiant energy source and from the planar lower surface toward the processing location.

11. The chamber of claim 10, wherein channels formed in the substrate receiving surface have a depth that increases from a center of the substrate receiving surface to a peripheral portion of the substrate receiving surface.

12. The chamber of claim 10, further comprising an edge ring disposed around the substrate support and having a reflective upper surface, wherein the substrate support also has a reflective upper surface.

13. The chamber of claim 10, wherein the substrate support has a reflective substrate receiving surface comprising a dielectric mirror.

14. The chamber of claim 10, wherein the radiant energy source has a reflective coating on a surface facing the processing location.

15. The chamber of claim 1, wherein the radiant energy source includes a heat lamp, a halogen lamp, a coaxial microwave or a millimeter wave source.

16. The chamber of claim 3, wherein the substrate support has a reflective upper surface.

17. The chamber of claim 1, further comprising a substrate support, and the radiant energy source assembly at least partially surrounds the substrate support.

18. The chamber of claim 10, further comprising a shadow ring having an inner diameter configured to shadow a portion of the substrate closest to the radiant energy source.

19. The chamber of claim 1, wherein a power source is operably coupled to the sputtering target.

20. The chamber of claim 10, wherein a power source is operably coupled to the sputtering target.

21. The chamber of claim 10, wherein the radiant energy source is disposed within the chamber on a plurality of discontinuous supports extending radially inward from the reflector.

\* \* \* \* \*